United States Patent
Wright et al.

(10) Patent No.: US 11,460,487 B2
(45) Date of Patent: Oct. 4, 2022

(54) OPERATIONAL CONTROL FOR AGRICULTURAL AGITATOR

(71) Applicant: CNH Industrial Canada, Ltd., Saskatoon (CA)

(72) Inventors: Jared Steven Wright, Saskatoon (CA); Nicholas George Alfred Ryder, Saskatoon (CA); Gregory Jacob Erker, Saskatoon (CA); Graham Douglas Stuart, Warman (CA)

(73) Assignee: CNH Industrial Canada, Ltd., Saskatoon (CA)

( * ) Notice: Subject to any disclaimer, the term of this patent is extended or adjusted under 35 U.S.C. 154(b) by 328 days.

(21) Appl. No.: 16/557,781

(22) Filed: Aug. 30, 2019

(65) Prior Publication Data

US 2021/0059119 A1    Mar. 4, 2021

(51) Int. Cl.
  *G01R 15/14*   (2006.01)
  *A01C 15/00*   (2006.01)
  (Continued)

(52) U.S. Cl.
  CPC ............ *G01R 15/14* (2013.01); *A01C 15/007* (2013.01); *A01C 19/02* (2013.01); *B01F 27/72* (2022.01); *B01F 35/212* (2022.01); *G01R 19/00* (2013.01); *G01R 19/12* (2013.01); *G01R 19/14* (2013.01); *G01R 19/16566* (2013.01); *G01R 19/25* (2013.01); *G01R 31/00* (2013.01); *G01R 31/08* (2013.01); *G01R 35/00* (2013.01); *H02H 7/08* (2013.01); *H02H 7/085* (2013.01); *H02J 13/00* (2013.01); *H02P 1/00* (2013.01); *H02P 29/00* (2013.01); *H02P 29/02* (2013.01); *H02P 29/40* (2016.02); *H05C 3/00* (2013.01);
  (Continued)

(58) Field of Classification Search
  None
  See application file for complete search history.

(56) References Cited

U.S. PATENT DOCUMENTS 4,319,298 A    3/1982   Davis et al.
6,170,241 B1 *  1/2001   Shibilski ............. H02H 7/0833
                                                          318/434

(Continued)

FOREIGN PATENT DOCUMENTS

CN        2850089       12/2006
CN      206589662       10/2017
(Continued)

OTHER PUBLICATIONS

Morris Eagle Console Electric/Hydraulic Drive Seed Rate Controller Operator's Manual, Copyright Topcon Precision Agriculture, Sep. 2011, 134 pages.

Primary Examiner — Daniel C Puentes
(74) Attorney, Agent, or Firm — Rebecca L. Henkel; Rickard K. DeMille

(57) ABSTRACT

An agricultural system includes a controller comprising a memory and a processor. The controller is configured to receive a sensor signal, determine a current flow based on the sensor signal, determine whether the current flow exceeds a current threshold for a time threshold, and operate a drive system of the agricultural system in an alternative operation instead of a normal operation in response to determining the current flow exceeds the current threshold for the time threshold.

18 Claims, 4 Drawing Sheets

(51) Int. Cl.
*A01C 19/02* (2006.01)
*H02H 7/085* (2006.01)
*H02H 7/08* (2006.01)
*G01R 19/14* (2006.01)
*G01R 31/00* (2006.01)
*G01R 31/08* (2020.01)
*G01R 19/00* (2006.01)
*H02P 1/00* (2006.01)
*H02J 13/00* (2006.01)
*G01R 19/12* (2006.01)
*G01R 35/00* (2006.01)
*H02P 29/00* (2016.01)
*G01R 19/25* (2006.01)
*H02P 29/02* (2016.01)
*H05C 3/00* (2006.01)
*H02P 29/40* (2016.01)
*G01R 19/165* (2006.01)
*B01F 27/72* (2022.01)
*B01F 35/212* (2022.01)
*H02P 29/024* (2016.01)

(52) U.S. Cl.
CPC ........ *G01R 19/2513* (2013.01); *G01R 31/007* (2013.01); *H02P 29/027* (2013.01)

(56) References Cited

U.S. PATENT DOCUMENTS

| | | | |
|---|---|---|---|
| 6,206,562 B1 * | 3/2001 | Eyraud | B01F 13/0827 366/273 |
| 7,652,438 B2 | 1/2010 | Rosskamp | |
| 7,714,588 B2 | 5/2010 | Montreuil | |
| 7,728,537 B2 | 6/2010 | Tomigashi | |
| 8,566,047 B2 | 10/2013 | Montreuil et al. | |
| 2004/0254654 A1 * | 12/2004 | Donnelly | H02J 3/14 700/22 |
| 2008/0303463 A1 * | 12/2008 | Darby | D06F 34/08 318/400.09 |

FOREIGN PATENT DOCUMENTS

| | | |
|---|---|---|
| EP | 2868182 B1 | 5/2018 |
| JP | 3424287 B2 | 7/2003 |
| JP | 2017189154 B2 | 10/2017 |
| JP | 6471443 B2 | 2/2019 |

* cited by examiner

OPERATIONAL CONTROL FOR AGRICULTURAL AGITATOR

BACKGROUND

The disclosure relates generally to controlling a drive system for an agricultural agitator.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, agricultural seeding implements are used to distribute particulate material, such as seeds, fertilizer, and/or other agricultural product, on or in an agricultural field using various methods. The agricultural seeding implement may be towed behind a work vehicle, such as a tractor. Certain embodiments of agricultural seeding implements include a storage tank in which the particulate material is stored and a metering system configured to meter the particulate material from the storage tank. The particulate material is distributed from the metering system to row units, which are configured to distribute the particulate material on or in the ground of the agricultural field.

As the storage tank is filled with the particulate material and/or while the particulate material flows from the storage tank to the metering system, the particulate material may form an undesirable profile within the storage tank. Several factors may contribute to this undesirable profile, including, but not limited to, friction between the particulate material and the storage tank, clumping of the particulate material, operation of the implement on a slope, and an inactive portion or inactive portions of the metering system. This undesirable profile may lead to uneven flow to the metering system, thereby causing an unwanted distribution or no distribution of the particulate material over and/or within certain regions of the agricultural field. As a result, the crop yield within these regions may be reduced, thereby reducing the efficiency of the seeding process.

BRIEF DESCRIPTION

Certain embodiments commensurate in scope with the disclosed subject matter are summarized below. These embodiments are not intended to limit the scope of the disclosure, but rather these embodiments are intended only to provide a brief summary of certain disclosed embodiments. Indeed, the present disclosure may encompass a variety of forms that may be similar to or different from the embodiments set forth below.

In certain embodiments, an agricultural system includes a controller comprising a memory and a processor. The controller is configured to receive a sensor signal, determine a current flow based on the sensor signal, determine whether the current flow exceeds a current threshold for a time threshold, and operate a drive system of the agricultural system in an alternative operation instead of a normal operation in response to determining the current flow exceeds the current threshold for the time threshold.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
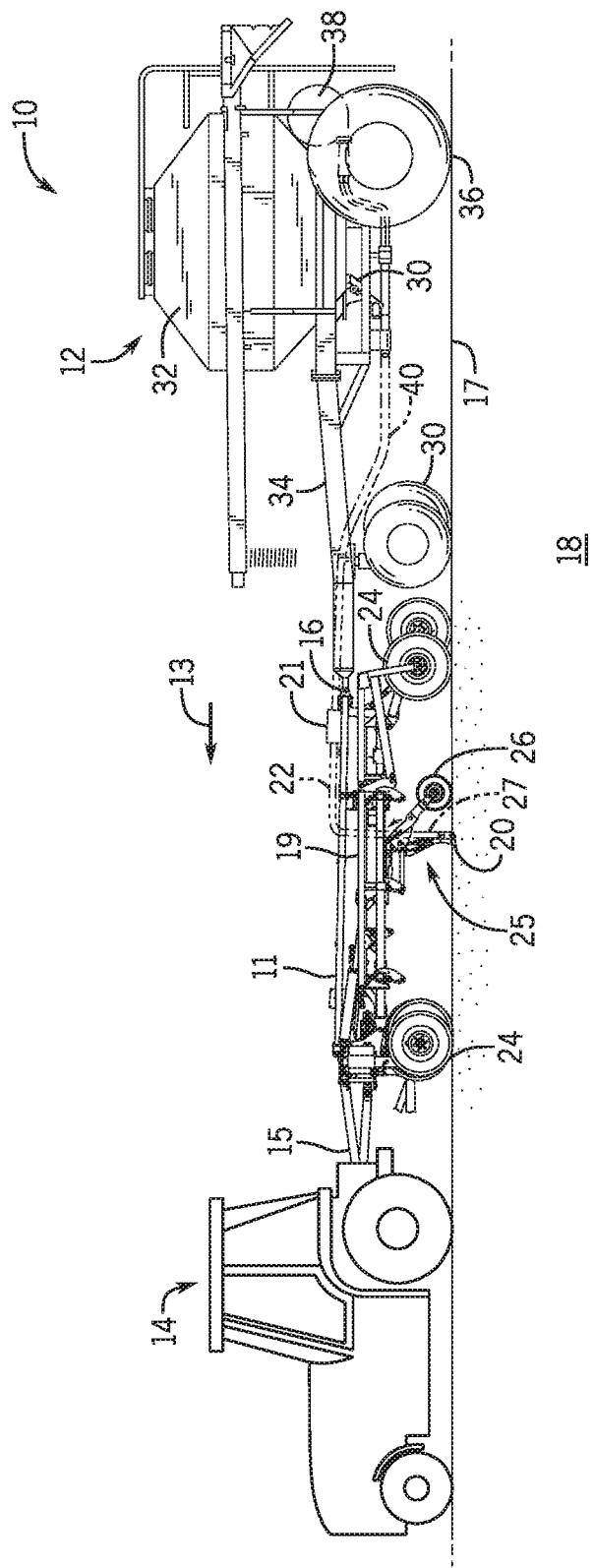
FIG. 1 is a side view of an embodiment of an agricultural system that includes an agricultural implement coupled to an air cart, in accordance with an aspect of the present disclosure.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising." "including," and "having" are intended to be inclusive and mean that there may be additional elements other than the listed elements. Any examples of operating parameters and/or environmental conditions are not exclusive of other parameters/conditions of the disclosed embodiments.

Embodiments of the present disclosure relate to agricultural systems having an agitator. Certain agricultural systems (e.g., air carts, implements, etc.) contain a particulate material (e.g., seeds, fertilizer, and/or other agricultural products) within a storage tank of the agricultural system. The agricultural system is configured to distribute the particulate material throughout a field. The particulate material may flow from the storage tank through a metering system, which is configured to control the flow of the particulate material to the field. In certain circumstances, the particulate material may clump within the storage tank and form a profile of the particulate material within the storage tank that may affect a manner in which the particulate material moves through the metering system. For example, the profile of the particulate material may cause a reduced amount of particulate material to flow through certain meters of the metering system.

As such, the agricultural system may include an agitating system configured to agitate the particulate material to break up clumping and/or adjust (e.g., level) the profile of the particulate material to enable the particulate material to flow through the metering system. As an example, the agitating system may include a drive system configured to drive an agitator to induce movement of particulate material within the storage tank. For example, the drive system may be controlled by a controller of the agricultural system based on certain operating parameters, such as a torque output of the drive system. However, implementing a drive system that is configured to measure torque may be costly and/or complex to incorporate and/or operate.

Thus, in accordance with the present disclosure, the controller may control the operation of the drive system based on another operating parameter, such as a current drawn by the drive system. In some embodiments, the agricultural system includes a sensing system communicatively coupled to the controller of the agricultural system and configured to monitor the current flowing through the drive system. The current flow may vary based on torque. Accordingly, the controller may operate the drive system based on the current, so as to agitate the particulate material while enhancing a structural longevity of the agitating system.

Turning now to the drawings, FIG. 1 is a side view of an embodiment of an agricultural system 10 that includes an agricultural implement 11 coupled to an air cart 12. In the depicted embodiment, the air cart 12 is towed behind the agricultural implement 11 relative to a direction of travel 13. In addition, the agricultural implement 11 is coupled to a work vehicle 14 (e.g., a tractor) by a first hitch system 15, and the air cart 12 is coupled to the agricultural implement 11 by a second hitch system 16. While the agricultural implement 11 is towed between the work vehicle 14 and the air cart 12 in the illustrated embodiment, in other embodiments, the agricultural implement may be towed behind the air cart. In further embodiments, the implement and the air cart may be part of a single unit that is towed behind the work vehicle, or the agricultural implement and the air cart may be elements of a self-propelled (e.g., autonomous) vehicle.

The agricultural implement 11 may be an agricultural seeding implement configured to deposit rows of particulate material (e.g., seeds) into soil of an agricultural field as the agricultural implement 11 is towed across a surface 17 of an agricultural field 18 by the work vehicle 14. The agricultural implement 11 includes a tool frame 19, a row unit 20 (e.g., a ground engaging opener system) coupled to the tool frame 19, a distribution header 21, a hose 22, and wheel assemblies 24. The wheel assemblies 24 contact the surface 17 to enable the agricultural implement 11 to be towed by the work vehicle 14. As the agricultural implement 11 moves in the direction of travel 13, a row of particulate material may be deposited into the soil by the row unit 20. Although only one row unit 20 is shown, the agricultural implement 11 may include multiple row units organized in a row across a width of the agricultural implement. In some embodiments, the agricultural implement 11 may include a row of 12, 14, 16, 18, 20, or more row units 20, which may each deposit a respective row of particulate material. Additionally or alternatively, the agricultural implement 11 may include multiple rows of row units.

To facilitate depositing particular material, each row unit 20 includes an opener 25, a press wheel 26, a tube 27, and a hydraulic cylinder. When the opener 25 engages the soil, the opener 25 may exert a force that excavates a trench into the soil as the row unit 20 travels through the field. In the present embodiment, a vertical position of the press wheel 26 controls the depth of the opener 25, and the hydraulic cylinder controls the downward force (e.g., a down pressure) applied by the press wheel 26. In addition, the opener 25 may be controlled to establish a target depth of the trench. The particulate material may then be deposited into the excavated trench via the tube 27. Then, the press wheel 26 may facilitate movement of the excavated soil into the trench to cover the particulate material and compress the soil covering the particulate material. In certain embodiments, the press wheel may not be a part of the row unit. Instead, for example, the press wheel may be mounted to the frame of the implement behind the row unit. Furthermore, while the illustrated row unit includes a ground engaging opener assembly, in alternative embodiments, at least one row unit on the implement may include an applicator assembly configured to deposit particulate material onto the surface of the field, or any other suitable type of product deposition assembly.

The air cart 12 may centrally store particulate material and distribute the particulate material to the row unit 20. Accordingly, the air cart 12 includes a particulate material metering system 30, a storage tank 32, an air cart frame 34, wheels 36, and an air source 38. In the depicted embodiment, the air cart frame 34 is coupled to the tool frame 19 via the second hitch system 16. The wheels 36 contact the surface 17 to enable the air cart 12 to be towed along with the agricultural implement 11. Additionally, the storage tank 32 may centrally store the particulate material for distribution. In some embodiments, the storage tank 32 may include multiple compartments for storing different types of particulate material. For example, a first compartment may store seeds while a second compartment may store a dry fertilizer. In such configurations, the air cart 12 may deliver both seeds and fertilizer to the agricultural implement 11 via separate distribution systems, or as a mixture through a single distribution system.

The particulate material metering system 30 may control the amount of particulate material distributed to the agricultural field 18. For example, the particulate material metering system 30 may be controlled to increase or decrease the amount of particulate material distributed to the agricultural field 18. As depicted, the particulate material metering system 30 is mounted to the bottom of the storage tank 32, which may enable the storage tank 32 to supply particulate material to the particulate material metering system 30. The particulate material metering system 30 may then distribute the particulate material to the row unit 20 via a line 40 extending to the distribution header 21. The distribution header 21 may then distribute the particulate material to one or more row units 20 via the line(s) 40. Some embodiments may include multiple distribution headers 21, with one or more row units 20 coupled to each distribution header 21 by line(s) 40. In this manner, the particulate material metering system 30 may control distribution of particulate material from the storage tank 32 to the row units 20 and into the trenches.

Figure 2:
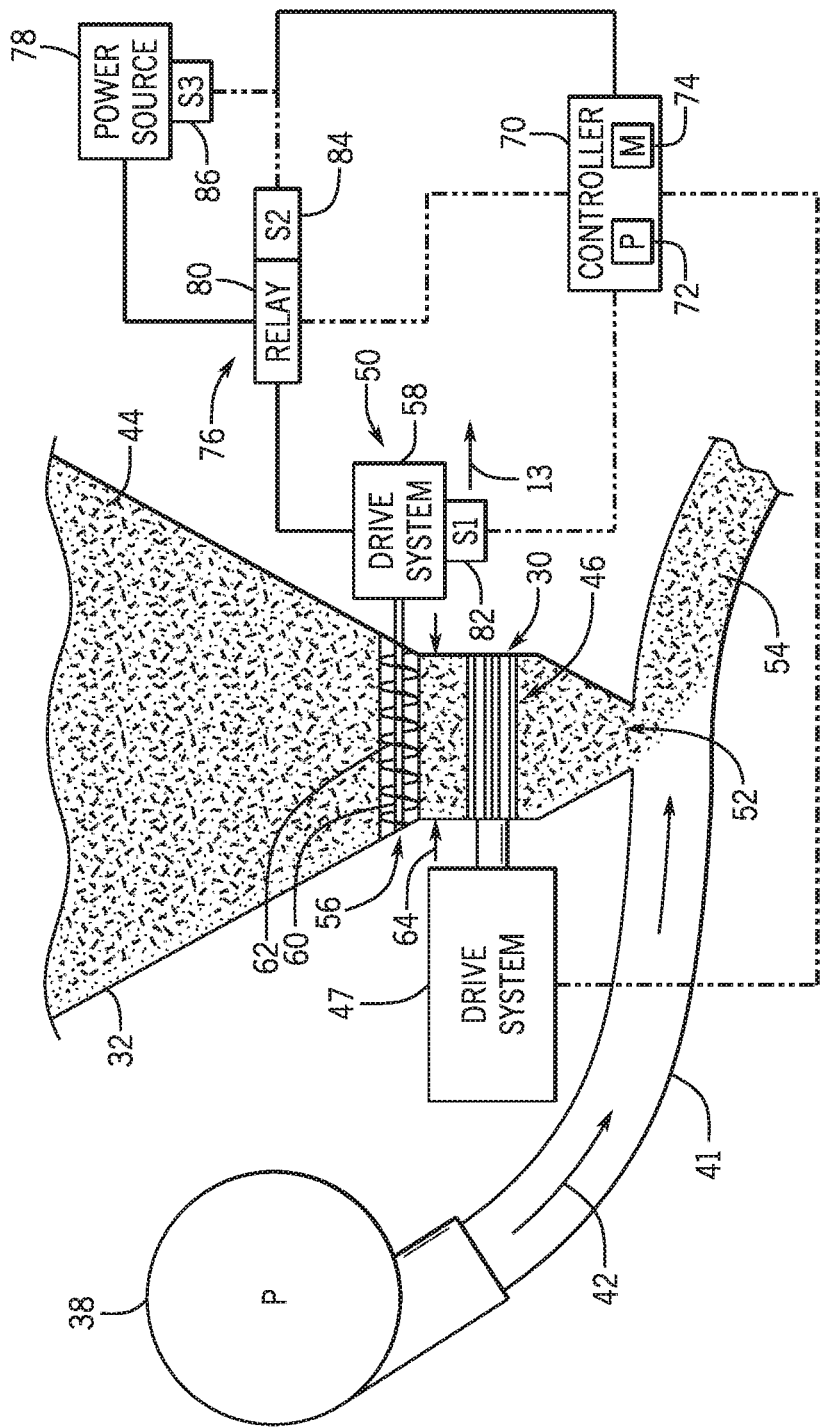
FIG. 2 is a schematic view of an embodiment of a particulate material metering system that may be employed within the air cart of FIG. 1, in accordance with an aspect of the present disclosure.

FIG. 2 is a schematic view of an embodiment of a particulate material metering system 30 that may be employed within the air cart of FIG. 1. As illustrated, the air source 38 is coupled to a conduit 41 configured to provide an air stream 42 past the particulate material metering system 30. The air source 38 may be a pump or blower powered by an electric or hydraulic motor, for example. Particulate material 44 (e.g., seeds, fertilizer, etc.) within the storage tank 32 flows by gravity through an agitating system 50 into the particulate material metering system 30. In certain embodiments, the storage tank 32 is pressurized such that a static pressure in the storage tank 32 is greater than a static pressure in the conduit 41, thereby facilitating an even flow of particulate material through the particulate material metering system 30. The particulate material metering system 30 includes one or more meter rollers 46 (e.g., rotatable metering devices) configured to regulate the flow of particulate material 44 into the air stream 42. For example, a certain particulate material metering system 30 may include twelve meter rollers 46, and each meter roller 46 be disposed within an independent housing and configured to flow particulate material into a respective conduit 41 for distribution to one or more respective row units of the agricultural implement. Such metering systems are known as "12-run" metering systems. However, in alternative embodiments, the particulate material metering system may include more or fewer meter rollers, such as 1, 2, 3, 4, 5, 6, 7, 8, 9, 10, 11, 13, or more.

In the illustrated embodiment, the meter roller 46 is coupled to a metering drive system 47 configured to drive the meter roller 46 to rotate. In certain embodiments, the metering drive system 47 may include a drive unit, such as an electric or hydraulic motor, configured to drive one or more meter rollers to rotate. In additional or alternative embodiments, each meter may include a respective metering drive system. In further embodiments, the metering drive system 47 may be coupled to a wheel (e.g., via a gear system) such that rotation of the wheel drives the meter roller 46 to rotate. Such a configuration automatically varies the rotation rate of the meter roller 46 based on the speed of the air cart.

In the illustrated embodiment, the meter roller 46 is oriented substantially parallel to the direction of travel 13 of the air cart. As used herein, substantially parallel may refer to an angle of about 0 to 45 degrees, about 0 to 30 degrees, about 0 to 15 degrees, about 0 to 5 degrees, or about 0 to 1 degree relative to an axis/direction (e.g., the direction of travel 13). By way of example, substantially parallel may refer to an angle less than 5 degrees, less than 4 degrees, less than 3 degrees, less than 2 degrees, less than 1 degree, or less than 0.5 degrees relative to an axis/direction. In further embodiments, the meter roller may be oriented substantially perpendicular to the direction of travel or at any other suitable angle.

For a particular meter roller configuration, the rotation rate of the meter roller 46 controls the flow of particulate material 44 into the air stream 42. For example, as the meter roller 46 rotates, the meter roller 46 transfers particulate material 44 through an opening 52 in the particulate material metering system 30 into the conduit 41 (e.g., into a conduit associated with a respective row unit or group of row units). The particulate material 44 then mixes with air from the air source 38, thereby forming a fluidized mixture 54. The fluidized mixture 54 then flows to the respective row unit(s) of the implement via pneumatic conduits, where the seeds and/or fertilizer are deposited within the soil.

Before entering into the particulate material metering system 30, the particulate material 44 flows through an agitator 56 of the agitating system 50, which is driven by an agitator drive system 58. As the particulate material 44 rests in the storage tank 32, the particulate material 44 may clump together to form pieces larger than the openings to the meter roller(s) 46. When the particulate material 44 flows through the agitating system 50, the clumps of particulate material 44 break into smaller pieces that are more suitable for flowing through the meter roller(s) 46. The agitator 56 includes a shaft 60 coupled to the agitator drive system 58 and extensions 62 coupled to the shaft 60. The extensions 62 may be wrapped around the shaft 60 (e.g., in a cylindrical form, conical form, helical form, etc.), may form loops that extend transversely relative to the shaft 60, may be positioned about the shaft 60 in any other suitable manner (e.g., in a square wave geometry), or a combination thereof, to enable the particulate material 44 to flow between the shaft 60 and the extensions 62. Additionally or alternatively, the extensions may include pins that extend away from the shaft (e.g., perpendicularly away from the shaft). Operation of the agitating system 50 may rotate the shaft 60 to cause the extensions to break up clumps of the particulate material 44, thereby placing the particulate material 44 in condition to enter the meter roller(s) 46. In addition, rotation of the shaft 60 may cause the agitator 56 to move particulate material 44 along a length 64 of the agitator 56. Although the present disclosure primarily discusses rotation of the agitator 56 to agitate the particulate material 44, in additional or alternative embodiments, the agitator may translate or move in another suitable manner to facilitate flow of the particulate material to the meter roller(s).

In further embodiments, the agitating system may be used for leveling purposes. As an example, a profile of the particulate material may become unevenly distributed (e.g., there may be more particulate material over certain meter rollers) in the storage tank. For instance, the air cart may travel over uneven terrain, causing the particulate material to shift due to external forces, leading to uneven distribution of the particulate material in the storage tank. For this reason, in some embodiments, the agitator may be used to move the particulate material to achieve a more evenly distributed profile of the particulate material across the length of the agitator.

In some embodiments, the agitating system 50 also includes a controller 70 that may be located on the air cart 12. As illustrated, the controller 70 is communicatively coupled to the metering drive system 47 and the agitator drive system 58. The controller 70 is configured to control the agitator drive system 58 to control the flow of particulate material 44 to the particulate material metering system 30, such as by altering the operational duration, the speed, and/or the direction of rotation of the agitator drive system 58. In addition, the controller 70 may control the rotation rate of the meter roller(s) 46 to control a rate at which the particulate material 44 is metered by the particulate material metering system 30 for deposition on the agricultural field.

In the illustrated embodiment, the controller 70 includes a processor 72, such as a microprocessor, and a memory device 74. The controller 70 may also include one or more storage devices and/or other suitable components. The processor 72 may be used to execute software, such as software for controlling the agitator drive system 58. Moreover, the processor 72 may include multiple microprocessors, one or more "general-purpose" microprocessors, one or more special-purpose microprocessors, and/or one or more application specific integrated circuits (ASICS), or some combination thereof. For example, the processor 72 may include one or more reduced instruction set (RISC) or complex instruction set (CISC) processors.

The memory device 74 may include a volatile memory, such as random access memory (RAM), and/or a nonvolatile memory, such as read-only memory (ROM). The memory device 74 may store a variety of information and may be used for various purposes. For example, the memory device 74 may store processor-executable instructions (e.g., firmware or software) for the processor 72 to execute, such as instructions for controlling the agitator drive system 58. The storage device(s) (e.g., nonvolatile storage) may include ROM, flash memory, a hard drive, or any other suitable optical, magnetic, or solid-state storage medium, or a combination thereof. The storage device(s) may store data (e.g., a parameter in which to operate the agitator drive system 58), instructions (e.g., software or firmware for controlling the agitator drive system 58), and any other suitable data. The processor 72 and/or memory device 74, or an additional processor and/or memory device, may be located in any suitable portion of the system. For example, a memory device storing instructions (e.g., software or firmware for controlling the agitator drive system 58) may be located in or associated with the agitator drive system 58.

In certain embodiments, the controller 70 is communicatively coupled to a drive control system 76, which is configured to control the agitator drive system 58. In the illustrated embodiment, the drive control system 76 includes a power source 78 and a relay 80. The power source 78 may be electrically coupled to the relay 80, which is electrically coupled to the agitator drive system 76. The power source 78 is configured to supply electrical power to the agitator drive system 58, and the relay 80 is configured to selectively enable the electrical power supplied by the power source 78 to be provided to the agitator drive system 58. For example, to activate the agitator drive system 58, the controller 70 may instruct the power source 78 to deliver electrical power, and the controller 70 may set the relay 80 in a first configuration (e.g., a closed circuit position), thereby enabling the electrical power to flow from the power source 78 to the agitator drive system 58. Thus, the agitator drive system 58 is powered to drive the agitator 56 to agitate the particulate material 44. To suspend operation of the agitator drive system 58, the controller 70 may instruct the power source 78 to terminate power output, and/or the controller 70 may set the relay 80 in a second configuration (e.g., an open circuit position) that blocks electrical power from flowing from the power source 78 to the agitator drive system 58. Thus, the agitator drive system 58 does not receive electrical power and, thus, does not drive the agitator 56 to agitate the particulate material 44. In additional or alternative embodiments, the controller may be directly coupled to the agitator drive system (e.g., without the relay). In this way, the controller is able to control an operating parameter of the agitator, such as the rotational speed and direction of the agitator.

The controller 70 is also communicatively coupled to various sensors of the drive control system 76 in which each sensor is configured to output a respective sensor signal to the controller 70. The controller 70 may control the operation of the agitator drive system 58 based on the received sensor signals. As an example, the drive control system 76 may include a current sensing system 82 configured to output a sensor signal indicative of a current flowing through the agitator drive system 58. In some embodiments, the current sensing system 82 may be electrically coupled to an electrical circuit of the agitator drive system 58, and the current sensing system 82 may monitor a voltage differential between two points on the electrical circuit (e.g., having a resistance between the two points). The current sensing system 82 may output a corresponding sensor signal indicative of the voltage differential to the controller 70. Based on the voltage differential and the resistance, the controller 70 may determine a corresponding current flow between the two points for use as the current flow through the agitator drive system 58. In additional or alternative embodiments, the current sensing system may include another suitable sensor and/or may monitor the current flow through the agitator drive system 58 in another suitable manner. The current flow through the agitator drive system 58 may correspond to an amount of torque applied by the agitator drive system 58. For example, the power source 78 may be configured to provide a substantially constant voltage to the agitator drive system 58 to enable the agitator drive system 58 to actuate the agitator 56. As the torque applied by the agitator drive system 50 increases, the agitator drive system 58 may draw additional current from the power source 78. The increased current flow and corresponding increased torque output of the agitator drive system 58 may overcome a resistance to rotation (e.g., caused by the particulate material) at the agitator 56. In some circumstances, limiting the current flow through the agitating system 50 may enhance (e.g., increase) a longevity of the agitating system 50. Thus, the controller 70 may control the operation of the agitator drive system 58 based on the current flow through the agitator drive system 58 to maintain a performance of the agitator drive system 58, as will be described below.

In the illustrated embodiment, the drive control system 76 may include a relay sensor 84 configured to determine a condition of the relay 80 and a power source sensor 86 configured to determine a condition of the power source 78. For example, the relay sensor 84 may determine whether the relay 80 is in the first configuration, which enables electrical power to be supplied to the agitator drive system 58, or in the second configuration, which blocks electrical power from being supplied to the agitator drive system 58. Additionally or alternatively, the relay sensor 84 may determine whether the relay 80 is operating normally. In one example, the relay sensor 84 may determine whether the relay 80 is successfully enabling electrical power to be supplied to the agitator drive system 58 while the relay 80 is in the first configuration. In another example, the relay sensor 84 may determine whether the relay 80 is successfully blocking electrical power from being supplied to the agitator drive system 58 while the relay 80 is in the second configuration. Further, the power source sensor 86 may determine whether the power source 78 is successfully supplying electrical power (e.g., whether the power source 78 is in operation). In additional or alternative embodiments, the relay sensor and/or the power source sensor may be omitted from the drive control system.

Figure 3:
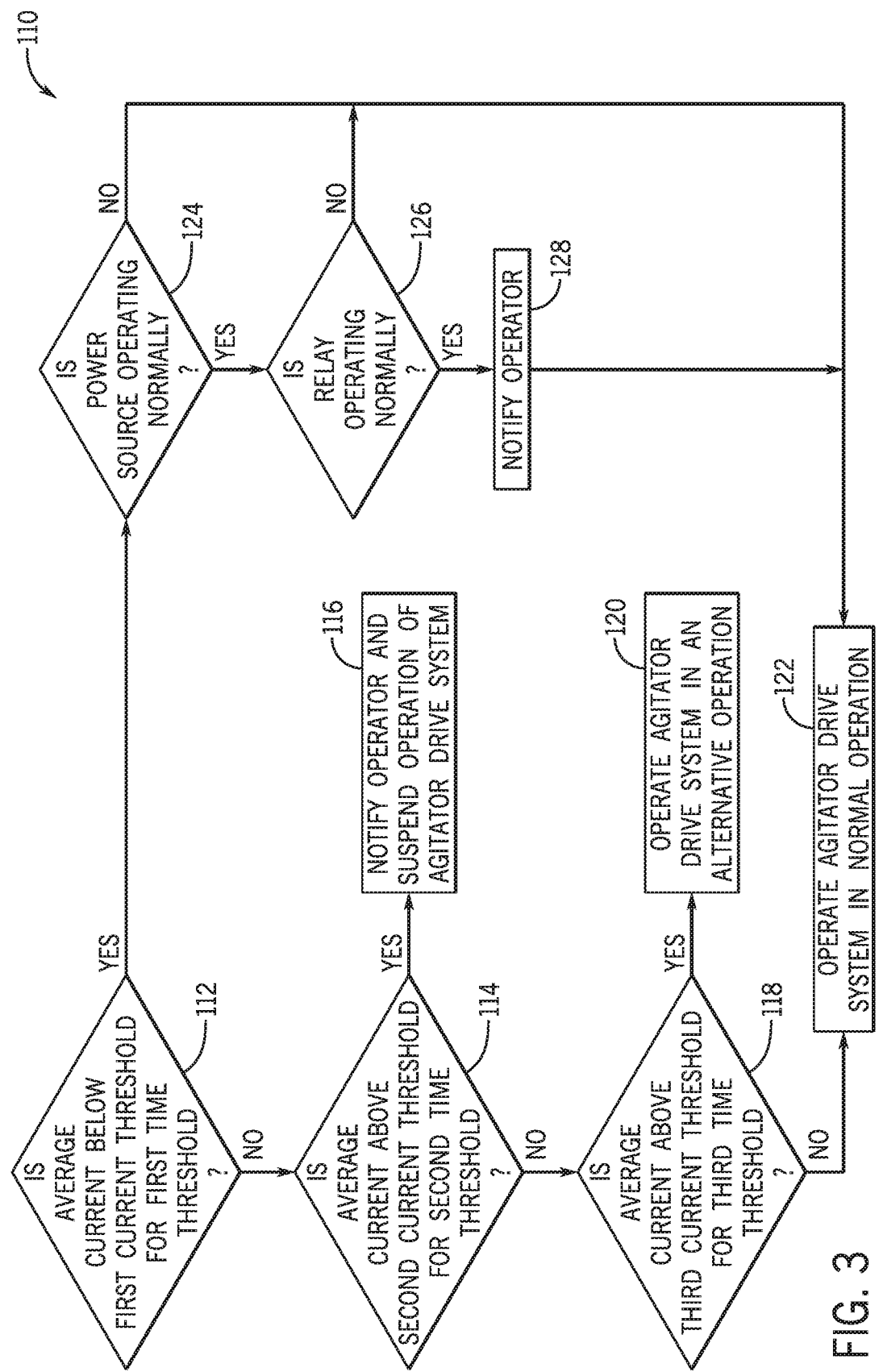
FIG. 3 is a flowchart of an embodiment of a method for operating an agitator drive system based on sensor signals from sensors of a drive control system, in accordance with an aspect of the present disclosure.
Figure 4:
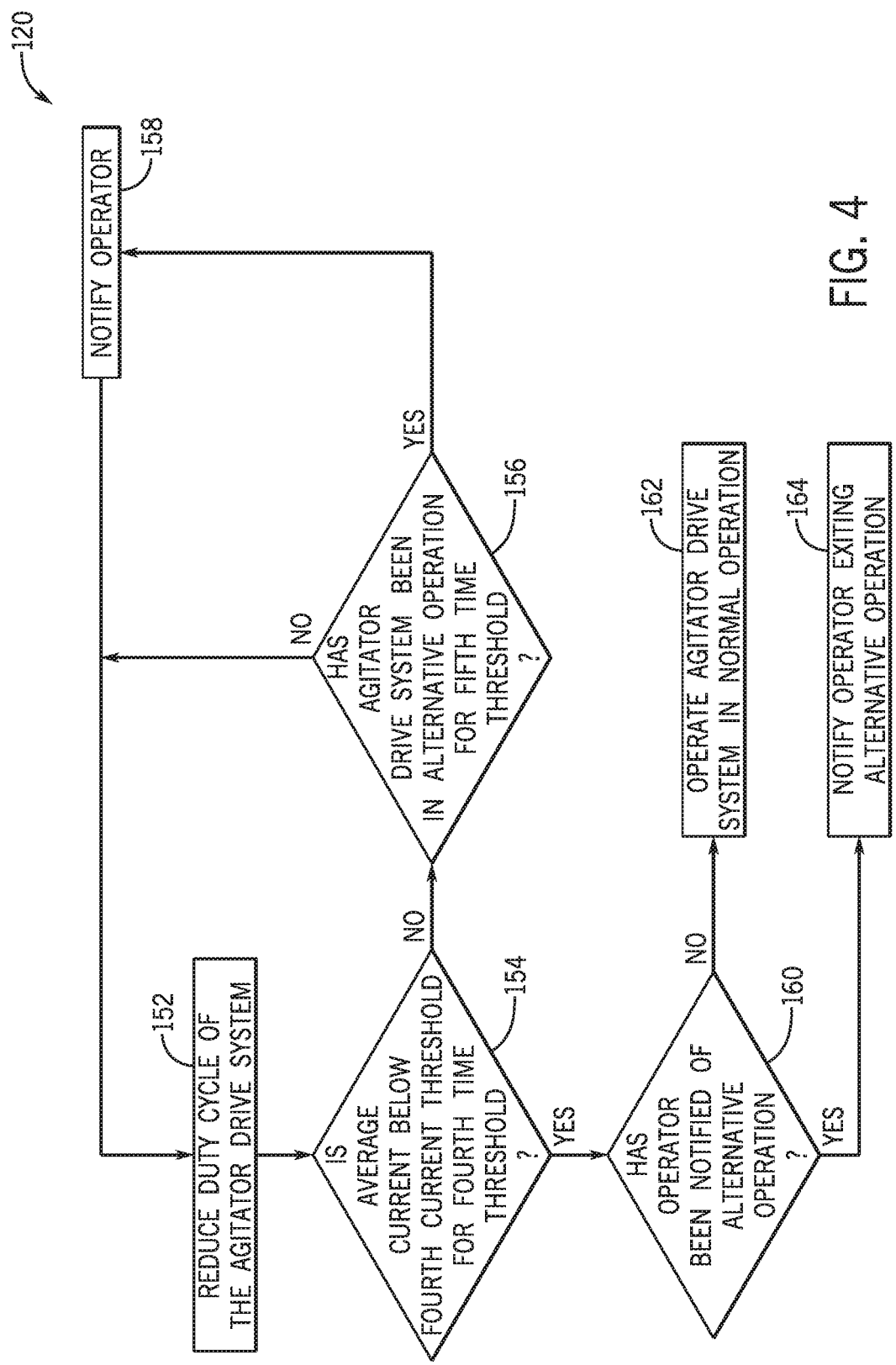
FIG. 4 is a flowchart of an embodiment of a method for operating an agitator drive system in an alternative operation, in accordance with an aspect of the present disclosure.

FIGS. 3 and 4 each illustrate a respective method or process for operating the agitator drive system. Each method may be performed by a controller, such as the controller 70. Additionally, each method may be performed differently than illustrated in FIGS. 3 and 4, such as for different embodiments of the agitator drive system. As an example, additional steps may be performed, or certain steps of the respective methods may be modified, removed, and/or performed in a different order.

FIG. 3 is a flowchart of an embodiment of a method 110 for operating the agitator drive system based on sensor signals from the sensors of the drive control system. At block 112, is it determine whether an average current flow through the agitator drive system is below a first current threshold for a first time threshold (e.g., a time between 1 and 4 seconds, between 2 and 5 seconds, between 0 and 6 seconds, such as 2.2 seconds). As discussed herein, the average current flow may refer to a mathematical mean value of current flow through the agitator drive system for a time interval (e.g., between 5 to 20 seconds, 0 and 30 seconds, between 3 and 15 seconds, such as 10 seconds). For example, the average current flow may be the mean value of current flow through the agitator drive system for the previous 10 seconds (e.g., as determined by the controller). The determined average current flow may be compared with the first current threshold. In certain embodiments, the first current threshold may be a current value between 0.1 A to 1 A, between 0.2 A and 2 A, between 0.3 A and 3 A, such as 0.3 A.

If the average current flow is not below the first current threshold for the first time threshold, it is determined whether the average current flow through the agitator drive system has been above a second current threshold for a second time threshold (e.g., which may be equal to the first time threshold, such as a time between 1 second and 4 seconds, or different than the first time threshold, such as a time between 3 and 10 seconds), as represented at block 114. For instance, the second current threshold may be a current value between 6 A and 10 A, between 7 A and 12 A, between 5 A and 8 A (e.g., 7.0 A) indicative of a stall condition of the agitator drive system.

If the average current flow exceeds the second current threshold for the second time threshold, the operation of the agitator drive system is suspended, as indicated at block 116. As such, the agitator drive system avoids drawing excessive current, thereby enhancing a structural longevity of the agitating system. In an example, the controller may output a control signal to the relay to transition the relay to the second configuration, thereby blocking the electrical power to the agitator drive system, and/or the controller may output a control signal to the power source to suspend operation of the power source. Therefore, electrical power to the agitator drive system is terminated. In some embodiments, a visual indication (e.g., a light, a display icon) is displayed to the operator, an audio indication is generated, another suitable notification is presented to the operator, or any combination thereof, thereby notifying the operator. In this way, the user interface informs the operator that the agitator drive system may be drawing excessive current, and the operator may adjust an operation of or perform maintenance on the agitator drive system or the agricultural system accordingly.

If the average current flow is not determined to exceed the second current threshold for the second time threshold, it is determined whether the average current flow exceeds a third current threshold (e.g., a current between 3 A and 4 A, between 2 A and 5 A, or between 1 A and 6 A, such as 3.7 A) for a third time threshold, as shown at block 118. Exceeding the third current threshold for the third time threshold may indicate that the agitator drive system is operating in an overload condition. By way of example, the agitator drive system may encounter an increased resistance from the particulate material and may draw additional current to overcome the resistance. The third time threshold (e.g., a time between 20 and 40 seconds, between 25 and 50 seconds, between 10 and 50 seconds, such as 30 seconds) may be greater than the first time threshold and the second time threshold to enable the agitator drive system to draw additional current for some time without adjusting its operation.

However, if it is determined that the agitator drive system draws current flow above the third current for the third time threshold, the agitator drive system may operate in an alternative operation, as shown at block 120. As will be further described herein, in the alternative operation, actuation of the agitator drive system may be adjusted. For instance, a duty cycle of the agitator drive system may be reduced to avoid constantly drawing an amount of current greater than the third current threshold.

If is determined the agitator drive system does not draw current flow above the first current threshold for the third time threshold, the agitator drive system may operate in a normal operation, as shown at block 122. As described herein, the normal operation may include operation of the agitator via a normal duty cycle, which agitates the particulate material effectively. For instance, the normal duty cycle may include alternating between drawing current to actively move the agitator and agitate the particulate material and drawing current to maintain or hold a position of the agitator and enable particulate material to flow unagitated. As a result, the agitator drive system may operate in the overload condition for a certain period of time. For example, the resistance imparted by the particulate material may be at an isolated location within the particulate material, and the agitator drive system may operate at the overload condition to overcome the resistance. As such, the agitator drive system may merely operate in the overload condition temporarily.

Returning to block 112, if that the average current flow through the agitator drive system is below the first current threshold for the first time threshold, a further determination is made regarding whether the power source is operating normally, as indicated at block 124. For example, an average current flow below the first current threshold may be indicative of a defective relay, an open circuit, or another condition in which the agitator drive system is not drawing sufficient current from the power source to actuate the agitator. In some embodiments, the sensor signal from the power source sensor is received for determining whether the power source is supplying the sufficient current to the agitator drive system. If the power source is determined to not operating normally, the agitator drive system may be operated in the normal operation described at block 122. For example, in some embodiments, the operator may have already been notified (e.g., by the user interface, by a different component of the agricultural system, etc.) that the power source is not operating normally. As such, the operator may inspect the power source or perform maintenance on the power source to determine whether or not the power source is operating normally. If the operator continues to enable the agricultural system to operate (e.g., the operator determines the power source sensor is faulty and that the power source is indeed operating normally), then the agricultural system may continue to operate in the normal operation. Alternatively, the operator may suspend operation of the agricultural system, and the agricultural system does not operate. Further, if the operator has not already been notified, a notification may be sent to the operator to inform the operator that the power source is not operating normally. Thus, the operator may adjust operation of the agricultural system or may inspect the power source accordingly.

If the power source is operating normally, it may then be determined whether the relay is operating normally, as shown at block 126. In certain embodiments, a sensor signal from the relay sensor indicative of the condition of the relay may be received. As used herein, the condition of the relay refers to whether the relay is successfully receiving a control signal from the controller. For instance, the condition may indicate that the relay is in the desirable configuration (e.g., the first configuration to block electrical power from flowing to the controller or the second configuration enabling electrical power to flow to the controller). If it is determined that the relay is not operating normally, the agitator drive system may be operated in the normal operation described with reference to block 122. In certain embodiments, the operator may have already been notified that the relay is not operating normally. As such, the operator may inspect the relay or perform maintenance on the relay to determine whether or not the relay is operating normally. If the operator continues to enable the agricultural system to operate (e.g., the operator determines the relay sensor is faulty and that the relay sensor is operating normally), then the agricultural system may continue to operate in the normal operation. Alternatively, the operator may suspend operation of the agricultural system, and the agricultural system does not operate. If the operator has not already been notified that the relay is not operating normally, the operator may then be notified. As such, the operator may adjust the operation of the agricultural system accordingly, or the operator may inspect the relay (e.g., for a defective relay, an open circuit, etc.).

If both the power source and the relay are operating normally, the operator may be notified that the average current is below the first current threshold for the first time threshold, as shown at block 128. The notification may inform the operator that the power source and the relay are operating normally, indicating that the agitator drive system should be receiving a sufficient current flow, but the current sensing system is not detecting sufficient current flow through the agitator drive system. For instance, such a circumstance may indicate that the current sensing system may not be detecting the current flow, even though the agitator drive system is receiving a sufficient amount of current. In this case, the agitator drive system may be operated in the normal operation, but the operator may be notified to inspect the current sensing system or to monitor the operation of the agricultural system accordingly.

FIG. 4 is a flowchart of an embodiment of a method for block 120 for operating the agitator drive system in the alternative operation. For example, the agitator drive system may be operated in the alternative operation as a result of determining the average current flow through the agitator drive system exceeds the third current threshold for the third time threshold, as described with reference to FIG. 3. In the alternative operation, at block 152, a duty cycle of the agitator drive system is reduced. As described herein, the duty cycle of the agitator drive system includes a ratio of an active time and a total time of operation of the agitator drive system. During the active time, the agitator drive system actuates the agitator to move and agitate the particular material. During the inactive time, the agitator drive system does not actuate the agitator, current is not constantly delivered to the agitator drive system. Tus, reducing the duty cycle, or reducing the ratio between the active time and the total time, may reduce an amount of time during which the agitator drive system receives current, thereby increasing a structural longevity of the agitating system.

In some embodiments, during the normal duty cycle of the agitator drive system, there may be no inactive time. That is, the agitator drive system may be constantly actuating the agitator, such that the duty cycle is 100 percent (i.e., the total time of operation of the agitator drive system includes only active time). When the agitator drive system is initially operated in the alternative operation, the duty cycle of the agitator drive system may be reduced from a normal duty cycle to a reduced duty cycle (e.g., a duty cycle between 50 percent and 80 percent of the normal duty cycle, between 75 percent and 99 percent of the normal duty cycle, between 60 percent and 90 percent of the normal duty cycle, between 30 percent and 95 percent of the normal duty cycle). For example, the agitator drive system may be operated at an 80 percent duty cycle, which may include 16 seconds of active time and 4 second of inactive time for each 20 second interval, or 8 seconds of active time and 2 seconds of inactive time for each 10 second interval. In other words, the agitator drive system is actively operated for 80 percent of the duration of the duty cycle. As another example, the agitator drive system may be operated at a 50 percent duty cycle, which may include 10 seconds of active time and 10 seconds of inactive time for each 20 second interval, or 5 seconds of active time and 5 seconds of inactive time for each 10 second interval. That is, the agitator drive system is actively operated for 50 percent of the duration of the duty cycle. In certain embodiments, during the reduced duty cycle of the alternative operation, the power source supplies substantially the same amount of electrical power as the power source supplies during the normal duty cycle of the normal operation. That is, actuation and movement of the agitator during the active time in the alternative operation may be substantially to the same as actuation of the agitator during the active time in the normal operation. However, there may be a greater amount of inactive time in the alternative operation than in the normal operation.

After one or more cycles (e.g., time intervals including active and inactive operation) are completed, it is determined whether the average current flow through the agitator drive system is below a fourth current threshold for a fourth time threshold, as shown at block 154. In some embodiments, the fourth current threshold is less than the third current threshold to reduce the possibility of the average current flow through the agitator drive system exceeding the third current threshold. For instance, the fourth current threshold may be 0.2 A, 0.5 A. or 1.0 A below the third current threshold. Additionally, the fourth time threshold (e.g., between 20 and 40 seconds, between 25 and 50 seconds, between 10 and 50 seconds, such as 30 seconds) may be substantially equal to the third time threshold. In this way, after the agitator drive system is operated through one or more cycles of the reduced duty cycle, it may be determined whether the agitator drive system is drawing a high enough current to remain in the alternative operation (e.g., the overload condition).

If the average current flow is not below the fourth current threshold for the fourth time threshold, indicating that the agitator drive system is drawing high enough current to remain in the alternative operation, it may be determined whether the agitator drive system has been operating in the alternative operation for a fifth time threshold (e.g., a time between 200 seconds to 500 seconds, between 100 and 300 seconds, between 300 and 450 seconds, between 50 and 400 seconds, such as 300 seconds), as indicated at block 156. If it is determined that the agitator drive system has not been operating in the alternative operation for the fifth time threshold, the method 120 returns to block 152 to further reduce the duty cycle of the agitator system. By way of example, the duty cycle of the agitator drive system may be reduced from an 80 percent duty cycle to a 60 percent duty cycle, which may include 12 seconds of active time and 8 seconds of inactive time for each 20 second interval. In some embodiments, the amount that the duty cycle is reduced may be based on the value of the average current flow determined by the controller. For instance, if it is determined that the average current flow is slightly greater than the fourth current threshold for the fourth time threshold, the duty cycle of the agitator drive system may be slightly reduce (e.g., by 1 percent, by 3 percent, by 5 percent). However, if it is determined that the average current flow is significantly greater than the fourth current threshold for the fourth time threshold, the duty cycle of the agitator drive system may be significantly (e.g., by 10 percent, by 15 percent, by 20 percent) reduced. As such, the agitator drive system may be operated in a subsequent reduced duty cycle to enhance the structural longevity of the agitating system.

In further embodiments, there may be a low duty cycle limit to which the duty cycle of the agitator drive system may be reduced. As an example, the low duty cycle limit may be a 20 percent duty cycle, which may include 4 seconds of active time and 16 seconds of inactive time for each 20 second interval. In this way, if it is determined that the average current value is below the fourth current threshold for the fourth time threshold and the agitator drive system is currently operating at the low duty cycle limit, the agitator drive system may continue to operate at the low duty cycle limit, rather than reducing the duty cycle of the agitator drive system below the low duty cycle limit.

If it is determined that the agitator drive system has been operating in the alternative operation for greater than the fifth time threshold, the operator may be notified, as shown at block 158. For example, the agitator drive system may not typically draw high enough current for a long enough time interval to remain in the alternative operation for greater than the fifth time threshold. As such, notifying the operator that the agitator drive system has been in the alternative operation for greater than the fifth time threshold may cause the operator to adjust the operation of the agitator drive system and/or inspect the agitator drive system accordingly to reduce the amount of current drawn by the agitator drive system.

Returning to block 154, if it is not determined that the average current flow through the agitator drive system does not exceed the fourth current threshold for the fourth time threshold, it is determined whether the operator has been notified that the agitator drive system has been operating in the alternative operation, as referenced in block 160. In this way, it is determined whether the agitator drive system had been operating in the alternative operation for greater than the fifth time threshold. As a result, the operator is notified of the operation in the alternative operation.

If the operator has not been notified that the agitator drive system was operating in the alternative system, the agitator drive system is returned to the normal operation, as shown at block 162, without providing any notification to the operator. In this manner, if the agitator drive system has not been operating in the alternative operation for the fifth time threshold, the duty cycle of the agitator drive system may have been reduced without notifying the operator. Moreover, if the operator has not been notified about the reduced duty cycle, the operation of the agitator drive system may return to the normal operation without notifying the operator. In an example, the agricultural system may move along a route or path in which a greater torque output is utilized to drive the agitator. The route may be a narrow strip in which certain meter rollers of the particulate material metering system may not be in operation. As a result, particulate material may not flow through certain parts of the particulate material metering system, and the particulate material may impart a high resistance on certain portions of the agitator. Therefore, the agitator drive system may draw a greater amount of current (e.g., above the fourth current threshold) to agitate the particulate material while the agricultural system is traversing the narrow strip. Drawing the greater amount of current may cause the agitator drive system to operate in the alternative operation while the agricultural system is traversing the narrow strip. After navigating the narrow strip, which may be completed in a time duration that is shorter than the fifth time interval, the amount of current drawn by the agitator drive system may be reduced to below the fourth current threshold. As such, the operator is not notified of the alternative operation.

Contrarily, if the operator has been notified of the alternative operation, indicating that the agitator drive system has been in the alternative operation for the fifth time threshold, then the operator may be notified that the agitator drive system is exiting the alternative operation, as shown at block 164. For example, if the agitator drive system is drawing current above the fourth current threshold for the fifth time threshold (e.g., after the agricultural system has traversed the narrow strip), the operator may be notified such that the operator may monitor, inspect, and/or change the operation of the agricultural system. If the agitator drive system then exits the alternative operation, the operator may be notified such that the operator is aware that the agitator drive system is no longer drawing current above the fourth current threshold, and the operator may no longer monitor the operation of the agricultural system. The agitator drive system is then operated in the normal operation, as shown at block 162.

It should be noted that although the present disclosure discusses each time threshold as a consecutive time threshold, in additional or alternative embodiments, the time threshold may include a total amount of time and/or a quantity value. That is, the time threshold may be calculated to be a total amount of time, which may be consecutive or non-consecutive (e.g., over an entire duration of operation of the agricultural system). For example, the average current may be above the third current threshold for 10 seconds, then below the third current threshold for 10 seconds, then above the third current threshold again for 10 seconds, thereby totaling 20 seconds above the third current threshold. As a result of the average current exceeding the third current threshold for 20 total seconds, the agitator drive system may be operated in the alternative operation. Additionally or alternatively, the time threshold may include a quantity value. For instance, the average current may be below the third current threshold for the previous 100 seconds, but may have surpassed (e.g., spiked) above the third current threshold at 5 different time intervals. As a result of surpassing the third current threshold at 5 different time intervals, the agitator drive system may be operated in the alternative operation. Furthermore, it should be noted that although the present disclosure discusses operating the agitator drive system based on the average current drawn by the agitator drive system, the agitator drive system may be operated based on other operating parameter(s), such as the instantaneous current drawn by the agitator drive system, a temperature of various components (e.g., the agitator drive system) of the agricultural system, a torque output of the agitator drive system, a rotational speed (e.g., in rotations per minute) of the drive system, another suitable operating parameter, or any combination thereof. Further still, certain time thresholds may be zero seconds. For instance, the second time threshold may be zero such that, the operator may be notified and the operation of the drive system may be suspended once the average current is determined to be exceed the second current threshold. In other words, a corresponding action may be performed once the current threshold is crossed.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. An agricultural system, comprising:
    a controller comprising a memory and a processor, wherein the controller is configured to:
        receive a sensor signal;
        determine a mathematical mean of a current flow for a time interval based on the sensor signal;
        determine whether the mathematical mean of the current flow exceeds a current threshold for a time threshold; and
        operate a drive system of the agricultural system in an alternative operation instead of a normal operation in response to determining the mathematical mean of the current flow exceeds the current threshold for the time threshold.

2. The agricultural system of claim 1, wherein the controller is configured to operate the drive system in the alternative operation by reducing a duty cycle of the drive system relative to the normal operation, the duty cycle of the drive system comprises a ratio between an active time of the drive system and a total time of operation of the drive system, and the controller is configured to flow current through the drive system during the active time.

3. The agricultural system of claim 2, wherein reducing the duty cycle of the drive system comprises reducing the ratio between the active time of the drive system and the total time of operation of the drive system.

4. The agricultural system of claim 2, wherein the active time of the drive system and the total time of operation of the drive system are substantially the same for the duty cycle of the drive system in the normal operation.

5. The agricultural system of claim 1, comprising a power source and a relay, wherein the power source is electrically coupled to the relay, the relay is electrically coupled to the drive system, the power source is configured to supply electrical power to the drive system, and the relay is configured to selectively enable the electrical power to be provided to the drive system.

6. The agricultural system of claim 5, wherein the controller is configured to:
    determine whether the mathematical mean of the current flow is below a second current threshold for a second time threshold during the normal operation of the drive system, wherein the second current threshold is lower than the current threshold; and
    in response to determining the mathematical mean of the current flow is below the second current threshold for the second time threshold, determine whether the power source is operating normally, and determine whether the relay is operating normally.

7. The agricultural system of claim 6, wherein the controller is configured to:
    instruct a user interface to notify an operator in response to determining the power source and the relay are both operating normally; and
    operate the drive system in the normal operation in response to determining the mathematical mean of the current flow is below the second current threshold for the second time threshold and the power source and the relay are both operating normally.

8. The agricultural system of claim 1, comprising:
    the drive system, wherein the drive system is configured to couple to an agitator and to receive a current to drive the agitator to move; and
    a sensing system communicatively coupled to the controller and configured to output the sensor signal indicative of the current flowing through the drive system to the controller.

9. At least one non-transitory computer readable medium comprising executable instructions that, when executed by a processor, are configured to cause the processor to:
    receive a sensor signal from a sensing system, wherein the sensor signal is indicative of a current flow through an agitator drive system of an agricultural system;
    determine the current flow based on the sensor signal;
    determine whether the current flow exceeds a first current threshold for a first time threshold;
    operate the agitator drive system in a normal operation in response to determining the current flow does not exceed the first current threshold for the first time threshold, wherein the normal operation comprises a duty cycle comprising an alternation between an active time of the agitator drive system and an inactive time of the agitator drive system to establish a ratio between the active time and a total time of operation of the agitator drive system; and
    operate the agitator drive system in an alternative operation instead of the normal operation in response to determining the current flow exceeds the first current threshold for the first time threshold, wherein the alternative operation comprises a reduced duty cycle comprising a reduced ratio between the active time and the total time of operation of the agitator drive system.

10. The at least one non-transitory computer readable medium of claim 9, wherein the instructions, when executed by the processor, are configured to cause the processor to:
    determine whether the current flow is below a second current threshold for a second time threshold during the alternative operation of the agitator drive system; and
    operate the agitator drive system in the normal operation instead of the alternative operation in response to determining the current flow is below the second current threshold for the second time threshold.

11. The at least one non-transitory computer readable medium of claim 10, wherein the instructions, when executed by the processor, are configured to cause the processor to further reduce the reduced ratio between the active time and the total time of operation of the agitator drive system in response to determining the current flow is not below the second current threshold for the second time threshold.

12. The at least one non-transitory computer readable medium of claim 11, wherein the instructions, when executed by the processor, are configured to cause the processor to:
    determine whether the agitator drive system has been operating in the alternative operation for a third time threshold in response to determining the current flow is not below the second current threshold for the second time threshold, wherein the third time threshold is greater than the first time threshold and the second time threshold; and
    instruct a user interface to notify an operator of operation of the agitator drive system in the alternative operation in response to determining the agitator drive system has been operating in the alternative operation for the third time threshold.

13. The at least one non-transitory computer readable medium of claim 12, wherein the instructions, when executed by the processor, are configured to cause the processor to:
  instruct the user interface to notify the operator of operation of the agitator drive system in the normal operation in response to instructing the user interface to notify the operator of the operation of the agitator drive system in the alternative operation and determining the current flow is below the second current threshold for the second time threshold; and
  operate the agitator drive system in the normal operation instead of the alternative operation in response to determining the current flow is below the second current threshold for the second time threshold.

14. An agricultural system, comprising:
  an agitator configured to induce movement of particulate material through the agricultural system;
  a drive system configured to couple to the agitator, wherein the drive system is configured to receive a current flow and to drive the agitator to move;
  a sensing system configured to output a sensor signal indicative of the current flow through the drive system; and
  a controller communicatively coupled to the sensing system and comprising a memory and a processor, wherein the controller is configured to:
    receive the sensor signal;
    determine an average current flow based on the sensor signal;
    determine whether the average current flow exceeds a first current threshold for a first time threshold; and
    reduce a duty cycle of the drive system from a normal duty cycle to a reduced duty cycle in response to determining the average current flow exceeds the first current threshold for the first time threshold, wherein the duty cycle comprises an alternation between an active time of the drive system and an inactive time of the drive system, and reducing the duty cycle comprises reducing a ratio between the active time and a total time of operation of the drive system.

15. The agricultural system of claim 14, wherein the controller is configured to:
  determine whether the average current flow is below a second current threshold for a second time threshold in response to determining the average current flow exceeds the first current threshold for the first time threshold; and
  continuously reduce the reduced duty cycle of the drive system in response to determining the average current flow is not below the second current threshold for the second time threshold.

16. The agricultural system of claim 15, wherein the controller is configured to increase the duty cycle to the normal duty cycle in response to determining the average current flow has been below the second current threshold for the second time threshold.

17. The agricultural system of claim 15, wherein continuously reducing the reduced duty cycle of the drive system comprises reducing the ratio between the active time of the drive system and the total time of operation of the drive system by an amount based on the average current flow.

18. The agricultural system of claim 14, wherein the controller is configured to:
  determine whether the average current flow exceeds a second current threshold for a second time threshold, wherein the second current threshold is greater than the first current threshold, and the second time threshold is less than the first time threshold; and
  terminate operation of the drive system in response to determining the average current flow exceeds the second current threshold for the second time threshold.

* * * * *